United States Patent [19]
Iwasaki

[11] Patent Number: 5,822,190
[45] Date of Patent: Oct. 13, 1998

[54] CARD TYPE MEMORY DEVICE AND A METHOD FOR MANUFACTURING THE SAME

[75] Inventor: Hiroshi Iwasaki, Yokohama, Japan

[73] Assignee: Kabushiki Kaisha Toshiba, Kawasaki, Japan

[21] Appl. No.: 871,967

[22] Filed: Jun. 10, 1997

[30] Foreign Application Priority Data

Jun. 11, 1996 [JP] Japan .................................. 8-149309

[51] Int. Cl.⁶ ........................................................ H05K 7/02
[52] U.S. Cl. .......................... 361/737; 235/488; 235/489; 235/490; 235/492; 235/441; 235/486; 257/678; 257/679; 257/684; 257/688; 257/689; 257/690; 257/699; 257/785; 361/736; 361/679; 361/683; 361/684; 361/686; 361/752; 361/753; 361/733
[58] Field of Search ...................................... 361/737, 736, 361/679, 683, 684, 686, 752, 753, 733; 257/678, 679, 684, 688, 689, 690, 699, 785; 235/488, 489, 490, 492, 441, 486

[56] References Cited

U.S. PATENT DOCUMENTS

| | | |
|---|---|---|
| 4,264,917 | 4/1981 | Ugon . |
| 4,943,464 | 7/1990 | Gloton et al. . |
| 5,013,900 | 5/1991 | Hoppe ........................ 235/492 |
| 5,153,818 | 10/1992 | Mukougawa et al. . |
| 5,155,663 | 10/1992 | Harase . |
| 5,272,374 | 12/1993 | Kodai et al. ................. 257/679 |
| 5,276,317 | 1/1994 | Ozouf et al. ................. 235/486 |
| 5,299,089 | 3/1994 | Lwee . |
| 5,375,037 | 12/1994 | LeRoux . |
| 5,550,709 | 8/1996 | Iwasaki . |
| 5,612,532 | 3/1997 | Iwasaki ....................... 235/492 |

FOREIGN PATENT DOCUMENTS

| | | |
|---|---|---|
| 0 214 478 | 3/1987 | European Pat. Off. . |
| 0 228 278 | 7/1987 | European Pat. Off. . |
| 0 321 326 | 6/1989 | European Pat. Off. . |
| 0 385 750 | 9/1990 | European Pat. Off. . |
| 0 406 610 | 1/1991 | European Pat. Off. . |
| 0 476 892 | 3/1992 | European Pat. Off. . |
| 2-301155 | 12/1990 | Japan . |
| 3-14192 | 1/1991 | Japan . |
| 3-2099 | 1/1991 | Japan . |
| 3-114788 | 5/1991 | Japan . |
| 4-16396 | 1/1992 | Japan . |
| 4-148999 | 5/1992 | Japan . |
| 5-134820 | 6/1993 | Japan . |
| 6-195524 | 7/1994 | Japan . |
| 6-236316 | 8/1994 | Japan . |
| 6-318390 | 11/1994 | Japan . |

OTHER PUBLICATIONS

E. Harari, Nikkei Electronics, Feb. 17, 1992, pp. 155–168.

Primary Examiner—Leo P. Picard
Assistant Examiner—David Foster
Attorney, Agent, or Firm—Finnegan, Henderson, Farabow, Garrett & Dunner, L.L.P.

[57] ABSTRACT

A card type memory device comprises a semiconductor chip having a nonvolatile semiconductor memory formed with external connection terminals and a metal frame comprising bed sections and external terminal electrode sections with a step section formed between the bed section and the external terminal electrode section, the bed sections of the metal frame being electrically connected to the external terminal electrode sections of the semiconductor chip. At least one surface and outer peripheral surface of the semiconductor chip are resin sealed such that at least electrode surfaces of the external terminal electrode sections of the metal frame are exposed substantially flush with a resin-sealed body surface. By doing so, a semiconductor package is formed. The semiconductor package is buried in a recess in a card type base board such that the electrode surfaces of the external terminal electrode sections of the metal frame in the semiconductor package is buried substantially flush with an external surface.

8 Claims, 5 Drawing Sheets

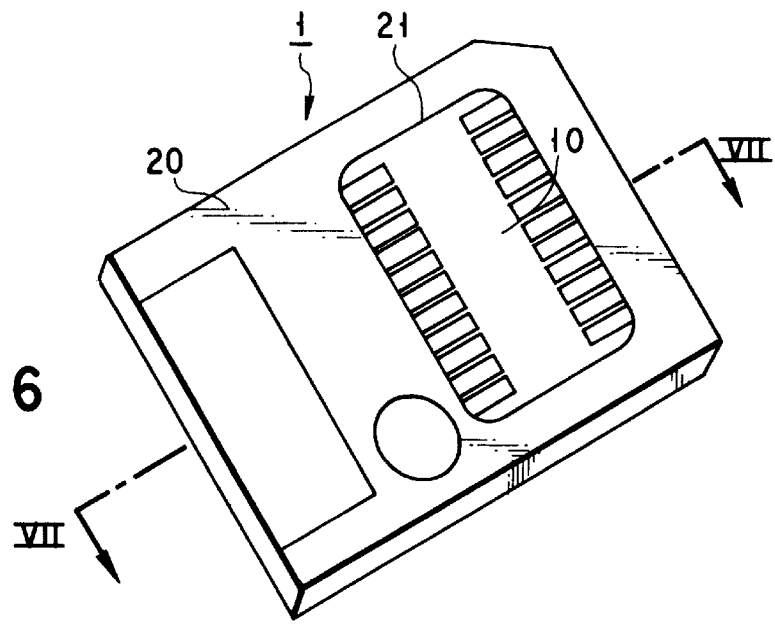
F I G. 6
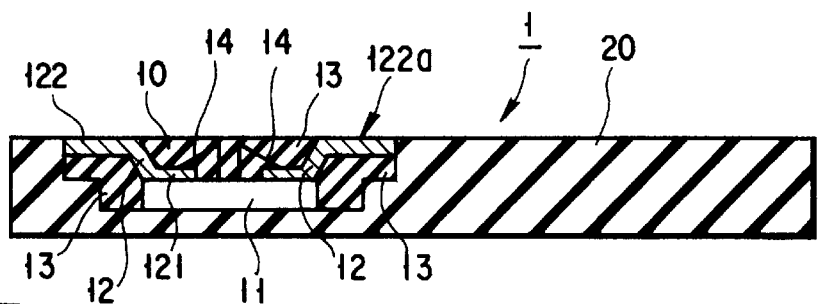
F I G. 7
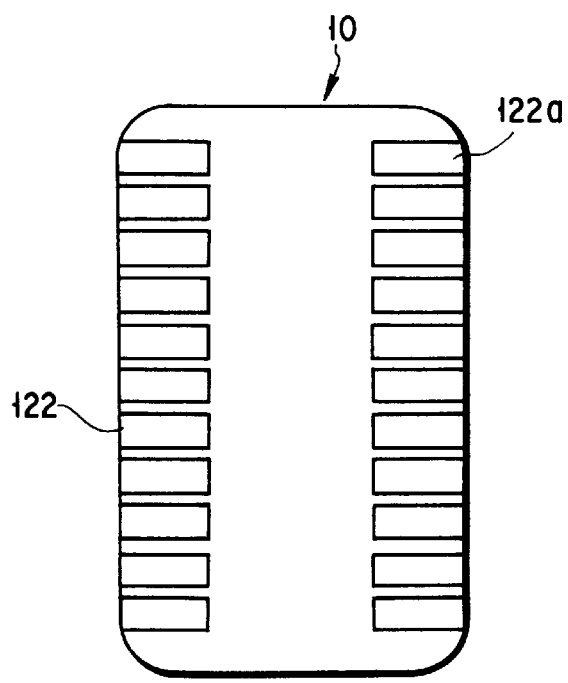
F I G. 8

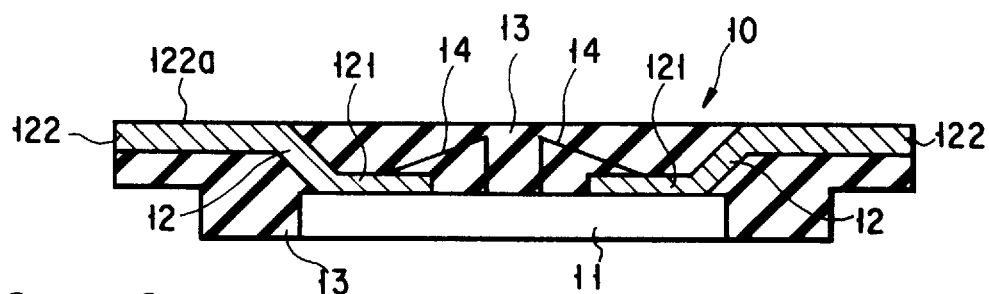
F I G. 9
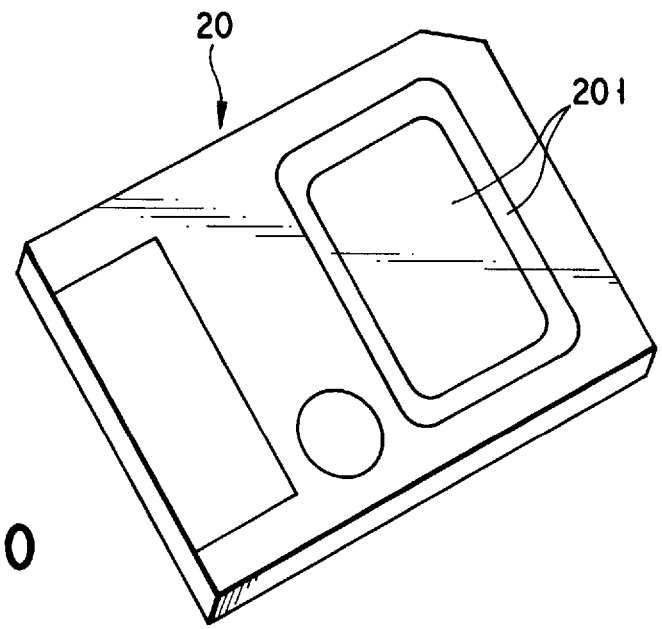
F I G. 10
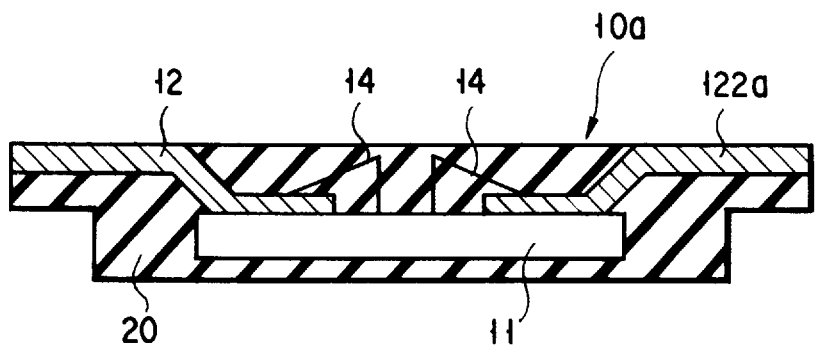
F I G. 11

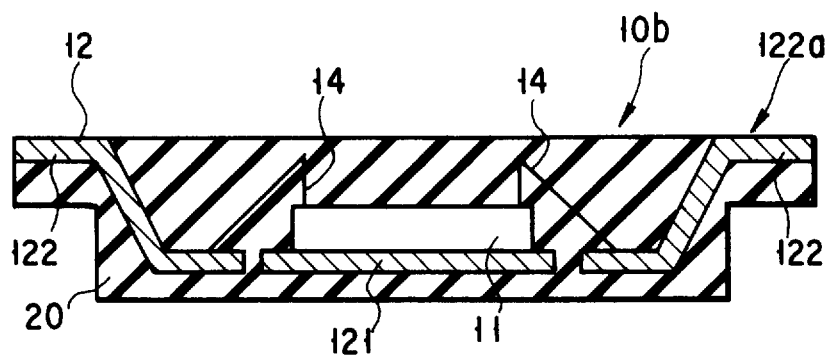
F I G. 12
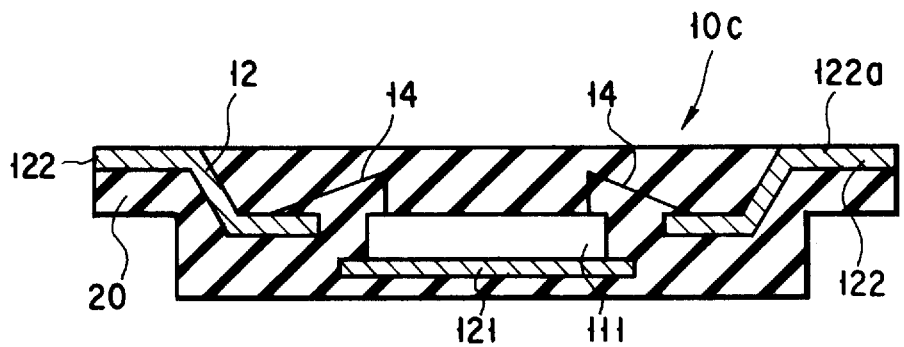
F I G. 13
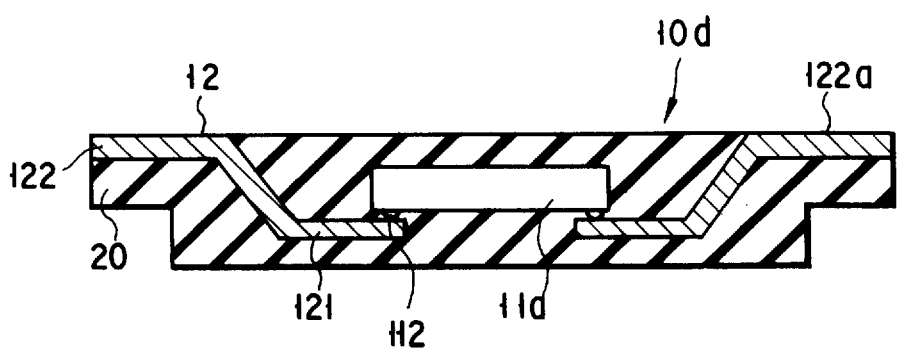
F I G. 14

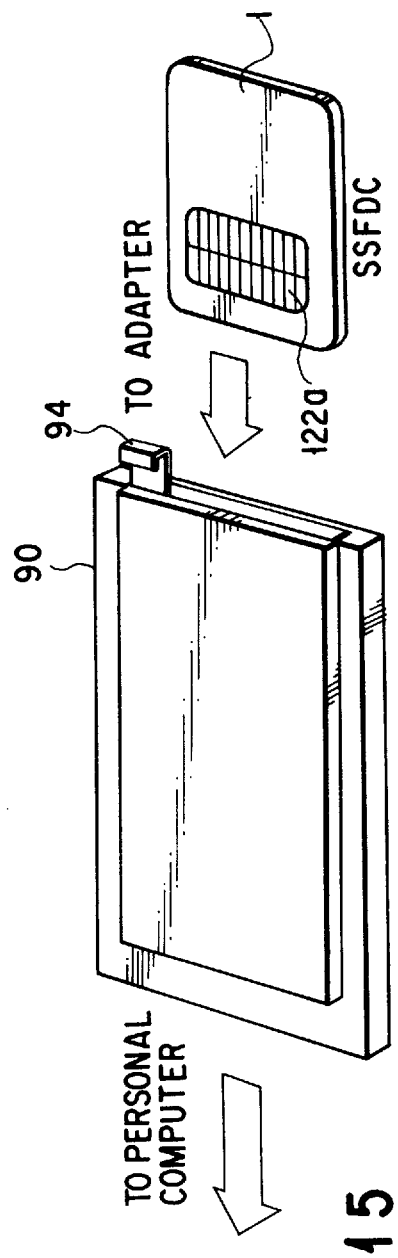
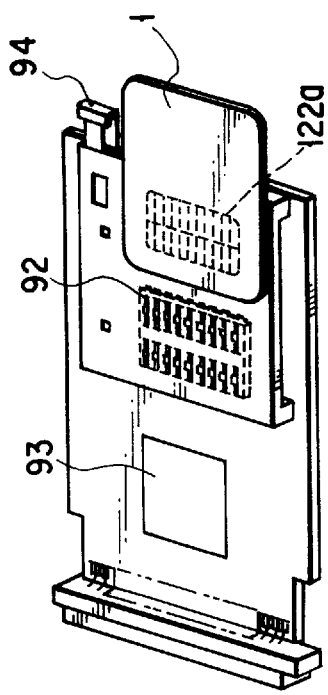
FIG. 15
FIG. 16

CARD TYPE MEMORY DEVICE AND A METHOD FOR MANUFACTURING THE SAME

BACKGROUND OF THE INVENTION

The present invention relates to a card type memory device for use in an external memory device in a computer system for example, and method for manufacturing the same and, in particular, a card type memory device for holding a semiconductor chip with a nonvolatile semiconductor memory formed therein and method for manufacturing the same.

The external memory device for a computer system includes a detachable type relative to a device body to which it is connected, such as a floppy disk as a typical example.

In recent times, an IC memory card with a built-in semiconductor memory chip has been widely used. The floppy disk has the advantage of being very low in cost, freely detachable from an associated device body in a single operation and freely portable, but it has the limitation of being unstable in reliability and slow in access time and, if being made compact in size, involving less memory capacity in view of a narrowed area of its device body and achieving a compact device body to which it is connected.

On the other hand, the IC card has the advantage of being higher in reliability and faster in access time. However, since it has a two-piece connector insertable and withdrawable into and out of the associated device body, there is some inconvenience at a time of its being freely inserted and withdrawed into and out of the device body.

In the case where there is less amount of data to be handled, such as a characters, still images and speech data, and data has to be readily transferred between a plurality of devices, it is desirable to use such an external memory device having a reliability and high-speed characteristic. As a result, a greater demand has been made for such a device to be developed.

Under these situations, the applicant proposed a novel card type external memory device having a chip of a nonvolatile memory (for example, a flash EEPROM of NAND type), as a memory medium, built therein, capable of lowering an overhead cost, other than that of the memory chip, to a minimal extent, being readily insertable and withdrawable into and out of an associated device body and being easily portable (JPN PAT APPLN KOKAI PUBLICATION 7-37049) and called it as an SSFDC (Solid State Floppy Disk Card).

The card type external memory device is shown in a perspective view in FIG. 1 and has a structure as indicated in cross-section taken along line II—II in FIG. 1 as shown in FIG. 2.

As shown in FIGS. 1 and 2, a semiconductor package 110 is buried in a recess in a card type base board 120.

FIG. 3 is a perspective view showing the semiconductor package 110 withdrawn out of the base board, as shown in FIG. 2.

FIG. 4 is a cross-sectional view as taken along line II—II in an arrow-indicated direction in FIG. 3. The semiconductor package 110 has a memory chip 112 mounted on a through hole type double-sided printed board 111. The pad of the memory chip 112 is electrically connected by a corresponding wire 114 to a print pattern 113 on a chip mount surface of a double-sided printed board.

And the surface side (chip mount side) of the printed board 111 is sealed by a resin 115 to cover the memory chip 112 and wire bonding 114. The print pattern 116 on the rear surface side of the printed board 111 is used as a flat-surface terminal electrode for external connection.

FIG. 5 shows the rear surface of the printed board 111.

The card type base board 120 has the package storable recess in one surface of the card type insulating resin such that, in the recess, the electrode surface of the semiconductor package 110 is exposed substantially flush with the external surface of the base board.

If, in this case, use is made of, as a memory chip 112, a chip of a nonvolatile memory of a 16M bit memory capacity, such as a NAND type flash EEPROM chip, it is possible to realize a 2M-byte memory capacity and achieve a unit exceeding 1.4M bytes, a typical memory capacity of a floppy-disk.

In the present time, the memory chip mount printed board 111 as shown in FIG. 4 almost always uses a resin board but further improvement of the quality-retaining characteristic is demanded.

There is a growing demand that the structure of a semiconductor package built in the conventional card type external memory device as well as its manufacturing process be further simplified.

BRIEF SUMMARY OF THE INVENTION

It is accordingly the object of the present invention to provide a card type memory device and a method for manufacturing the same which obviates the need to provide a resin board, solves a poor quality-retaining characteristic by mounting a semiconductor chip on the bed portions of a metal frame, simplifies a built-in semiconductor package structure and manufacturing steps involved and further lowers the manufacturing costs.

In order to achieve the above-mentioned object, the card type memory unit of the present invention comprises:

a semiconductor package including a semiconductor chip having a nonvolatile memory with external connection terminals formed there; a metal frame comprising bed sections with the semiconductor chip mounted thereon and external terminal electrode sections with a step section defined between the bed section and the external terminal electrode section, the external connection terminals of the semiconductor chip being electrically connected to the corresponding bed sections, and a resin section with which at least one surface of the semiconductor chip and outer peripheral surface and at least electrode surfaces of the external terminal electrode section of the metal frame are sealed such that at least the electrode surfaces of the external terminal electrode sections of the metal frame are exposed substantially flush with an outer surface of the resin section; and a card-type base board having a recess in which the semiconductor package is buried such that the exposed electrode surfaces of the metal frame and resin-sealed surface of the semiconductor package are exposed substantially flush with an outer surface of the base board.

In another aspect of the present invention there is provided a card type memory unit comprising:

(a) a semiconductor package including a semiconductor chip having a nonvolatile memory with external connection terminals formed there; a metal frame comprising bed sections with the semiconductor chip mounted thereon and external terminal electrode sections with a step section defined between the bed section and the external terminal electrode section, the external connection terminals of the semiconductor chip being electrically connected to the corresponding bed sections, and a resin section with which at least one surface of the semiconductor chip and outer peripheral surface and at least electrode surfaces of the external terminal electrode section of the metal frame are sealed such that at least the electrode surfaces of the external terminal electrode sections of the metal frame are exposed substantially flush with an outer surface of the resin section; and a card-type base board having a recess in which the semiconductor package is buried such that the exposed electrode surfaces of the metal frame and resin-sealed surface of the semiconductor package are exposed substantially flush with an outer surface of the base board; and (b) a card type adaptor comprising a card holding section for allowing the card type memory unit to be inserted therein or withdrawn therefrom;

a connector which, with the card type memory unit set in the card holding section, is set in contact with, and electrically connected to, the electrode surfaces of the external terminal electrode sections of the card type memory unit; and an interface section having an interface function to an associated apparatus.

In another aspect of the present invention there is provided a method for manufacturing a card type memory device, comprising the steps of:

preparing a metal frame having bed sections and external terminal electrode sections with a step section formed between the bed section and the external terminal electrode section and a semiconductor chip having a nonvolatile semiconductor memory and pads formed for external connection terminals;

bonding one surface of the semiconductor chip to the bed sections of the metal frame;

electrically connecting the pads of the semiconductor chip to the metal frame, by metal fine wires, as a bonding connection;

resin-sealing all the metal fine wires, at least a pad formation surface and external peripheral surface of the semiconductor chip and a portion of the metal frame such that electrode surfaces of the external terminal electrode sections of the metal frame are buried substantially flush with a resin sealed body surface and, by doing so, forming a semiconductor package; and burying the semiconductor package in a recess in a card type base board such that the electrode surface of the semiconductor package is buried substantially flush with an outer surface of the card type base board.

In another aspect of the present invention there is provided a method for manufacturing a card type memory device, comprising the steps of:

preparing a metal frame having bed sections and external terminal electrode sections with a step section formed between the bed section and the external terminal electrode section and a semiconductor chip having a nonvolatile semiconductor memory and bumps for external connection terminals;

face down connecting a bump formation surface of the semiconductor chip to the bed sections of the metal frame;

resin-sealing at least a bump formation surface and outer peripheral surface of the semiconductor chip and portion of the metal frame such that electrode surfaces of the external terminal electrode sections of the metal frame are exposed substantially flush with a resin body surface and, by doing so, forming a semiconductor package; and burying the semiconductor package in a recess in a card type base board such that the electrode surface of the semiconductor package is buried substantially flush with an outer surface of the card type base board.

According to the card type memory device of the present invention and method for manufacturing the same, therefore, it is possible to simplify a semiconductor package structure built in the card type memory device, as well as its manufacturing process and to further lower a manufacturing cost. The device and method of the present invention can be very suited for use in an associated external memory apparatus, such as a digital still camera, voice recorder and game machine. Further it is also possible to achieve an IC memory card type storage device having the same external configuration as an IC memory card for a personal computer, etc.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is an outer perspective view showing a card type memory device according to an embodiment of the present invention;

FIG. 7 is a perspective view taken along line VII—VII in an arrow-indicated direction in FIG. 6;

FIG. 8 is a plan view showing a semiconductor package withdrawn out of a base board;

FIG. 9 is an enlarged perspective view showing a FIG. 7 semiconductor package withdrawn out of the base board;

FIG. 10 is an outer perspective view showing a card type base board used in the present invention;

FIG. 11 is an enlarged cross-sectional view showing a modification having a different cross-section from that of FIG. 9;

FIG. 12 is an enlarged cross-sectional view showing another modification having a different cross-section from FIG. 9;

FIG. 13 is an enlarged cross-sectional view showing another modification having a different cross-section from FIG. 9;

FIG. 14 is an enlarged cross-sectional view showing another modification having a different cross-section from FIG. 9;

FIG. 15 is an explanary view for explaining the mounting operation between a card type adaptor for a personal computer as a practical example of a card type memory device of the present invention and an IC card; and FIG. 16 shows the state of an SSFDC 1 mounted in a card storage section of the adaptor card as shown in FIG. 15.

DETAILED DESCRIPTION OF THE INVENTION

Figure 1:
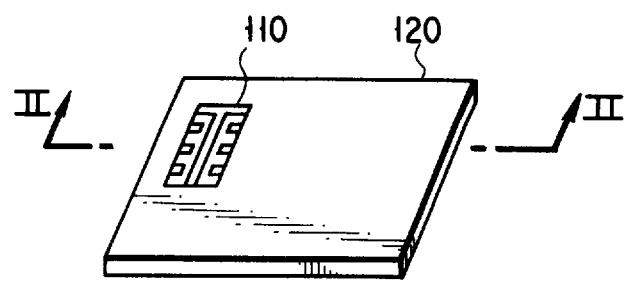
FIG. 1 is a perspective view showing an external memory device of a conventional card type.
Figure 2:
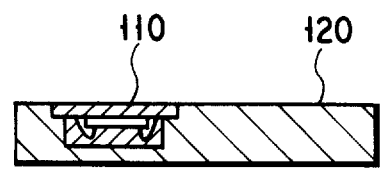
FIG. 2 is a cross-sectional view taken along line II—II in an arrow-indicated direction.
Figure 3:
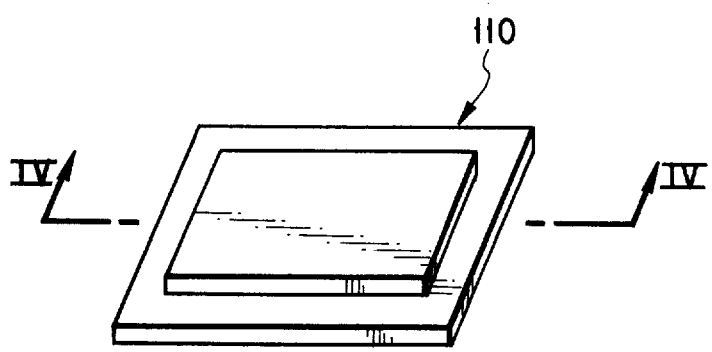
FIG. 3 is an outer, perspective view showing the semiconductor package of FIG. 2 with its portion withdrawn.
Figure 4:
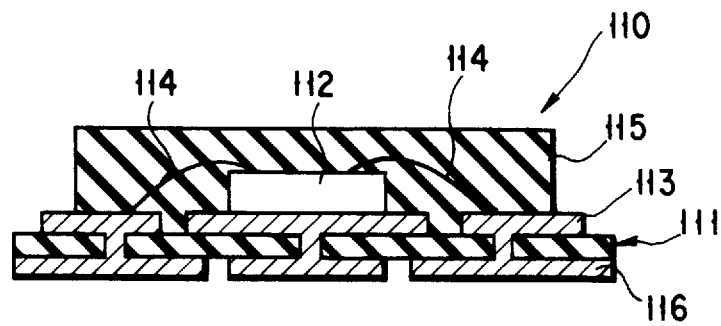
FIG. 4 is a cross-sectional view, taken along line IV—IV in an arrow-indicated direction.
Figure 5:
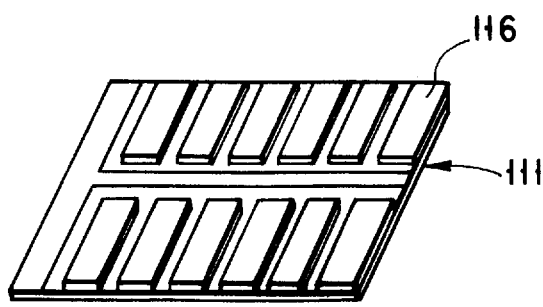
FIG. 5 shows a rear surface of a printed board 111 in FIG. 4.

One embodiment of the present invention will be explained below in more detail with reference to the accompanying drawing.

FIG. 6 is a diagrammatic view showing an outer appearance of a card type memory device 1 according to a first embodiment of the present invention.

FIG. 7 is a cross-sectional view taken along line VII—VII in an arrow-indicated direction. In FIG. 7, a recess 21 is provided in a base board 20 and a semiconductor package 10 is buried in the recess 21 of the base board 20.

The base board 20 has the size of a postage stamp, for example, substantially 37 mm in one dimension×45 mm in another dimension×0.76 mm in thickness.

The semiconductor package 10 has a size of, for example, 17.27 mm in one dimension×28.24 mm in another dimension×0.665 mm in thickness.

FIG. 8 is a plan view showing the semiconductor package 10 taken out of the base board 20 as shown in FIG. 6 and FIG. 9 is an enlarged, cross-sectional view showing the semiconductor package 10 taken out of the base board 20 as shown in FIG. 7.

The semiconductor package 10 comprises a semiconductor chip 11 providing a nonvolatile semiconductor memory (for example, a flash EEPROM of a NAND type) having external connection terminals, a metal frame 12 electrically connected to the external connection terminals of the semiconductor chip 11, and a resin package 13 where the semiconductor chip 11 and at least a portion of the metal frame 12 are sealed and fixed in place. The metal frame 12 here mentioned may be made of the same material as that of the lead frame used for an ordinary semiconductor product.

In this case, the metal frame 12 has, as shown in FIG. 9, a bed section 121 to be attached to the semiconductor chip and an external terminal electrode section 122, both made up of a metal plate of, for example, 125 μm, with a step section of, for example, about 180 to 250 μm provided between the bed section 121 and the external terminal electrode section 122.

Further, the semiconductor chip 11 has pads, not shown, for the external connection terminals and a portion of a chip's surface side (pad formation surface side) is bonded to the lower surface side of the bed section 121 of the metal frame 12.

The pad and metal frame 12 are attached and electrically connected by metal thin wires to each other. In this case, the metal fine wire 14, that is, the loop-like one, is set about 30 to 50 μm lower than the external terminal electrode section 122 of the metal frame.

Further, the resin package 13 seals one surface (a pad formation surface side in the present embodiment) and outer peripheral surface of the semiconductor chip 11 such that those electrode surfaces 122a of the external terminal electrode section 122 of the metal frame 12 are exposed substantially flush with the resin-sealed body surface.

The base board 20 has, as shown in FIG. 10, a semiconductor package holding recess 201 in one surface of its card type insulating resin body of, for example, of 37 mm in one dimension×45 mm in another dimension×0.76 mm in thickness. And the electrode surfaces 122a (FIG. 11) of the semiconductor package 10 are buried in the recess 201 in a manner to be made substantially flush with the outer surface of the base board.

Here, the bonding of the semiconductor package 10 to the recess 201 of the base board 20 is achieved by providing at least engaging step sections there to allow the inner wall of the recess 201 and outer peripheral surface of the resin package 13 to engage with each other and attaching both to each other by a bonding agent, not shown.

In this connection it is to be noted that the above-mentioned bonding may also be achieved by applying a bonding agent to the inner central area of the recess 201.

The method for manufacturing the card-type memory device shown in FIGS. 6 and 7 will be explained below by way of example.

First, prepared is a metal frame 12 having a bed section 121 and external terminal electrode section 122 with a step section provided therebetween as well as a semiconductor chip 11 having a nonvolatile semiconductor memory and pads for external connection terminals.

Then, as shown in FIG. 9, the one surface of the semiconductor chip 11 is attached to the bed section 121 of the metal frame and the pads of the semiconductor chip 11 are bonding-connected by metal fine wires 14.

All the metal fine wires 14, pad formation surface and outer peripheral surface of the semiconductor chip 11 and portion of the metal frame 12 are resin-sealed such that the electrode surfaces of the external terminal electrode section 122 are exposed substantially flush with the resin-sealed body surface. A semiconductor package 10 is formed by doing so.

In this case, a metal mold is so provided as to set the electrode surface of the external terminal electrode section 122 of the metal frame 12 in contact with the metal mold. And a resin is filled in the metal mold to provide a molding.

As shown in FIG. 10, prepared is a card-type resin base board 20 having a recess 201 for holding the semiconductor package 10 in place. The semiconductor package 10 is buried in the recess 201 such that the electrode surface of the semiconductor package 10 is exposed substantially flush with the outer surface of the base board 20.

With reference to FIGS. 11 to 14, an explanation will be given below about modifications each having a semiconductor package 10 of a different cross-section from in FIG. 9.

A semiconductor package 10a shown in FIG. 11 is similar to that of FIG. 9 except that a rear surface side of a semiconductor chip 11 is also covered with a resin as shown in FIG. 11. Therefore, the same reference numerals are employed to designate parts or elements corresponding to those shown in FIG. 9.

The modification can be adapted for the case where there is an allowance between the thickness of a base board 20 and that of a semiconductor package 10a.

By doing so, added strength can be provided to the semiconductor package 10a and, further, it is possible to achieve protection from electrical contact on the rear surface side of the semiconductor chip 11.

A semiconductor package 10b shown in FIG. 12 is similar to the counterpart of FIG. 9 except that the rear surface side, that is, not the pad formation surface side, of the semiconductor chip 11 is bonded to a bed section 121 of a metal plate 12. And the same reference numerals are employed to designate parts or elements corresponding to those shown in FIG. 9.

In the modification shown in FIG. 12, since there is less allowance between the loop height of a metal fine wire 14 and the height of an external terminal electrode section 122 of the metal frame 12, it is desirable to use a metal fine wire of a lower loop.

By doing do, it is possible to impart added strength to the semiconductor package 10b, to provide improved stability upon the mounting of a memory chip and to provide simpler steps and a lowering in manufacturing cost.

A semiconductor package 10c shown in FIG. 13 is similar to the counterpart of the semiconductor package 10 shown in FIG. 10 except that a bed section 121 of a metal frame 12 is located in a position lower than that of a metal fine wire bonding section of an external terminal electrode section 122 and that a high step section is provided between the bed section 121 and the electrode surface of the external terminal electrode section 122. And the same reference numerals are employed to designate parts or elements corresponding to those shown in FIG. 9.

In the improvement shown in FIG. 13, it is possible to lower the loop level of the metal fine wire 14.

A semiconductor package 10d shown in FIG. 14 is similar to the counterpart of FIG. 9 except the manner in which a semiconductor chip 11a is connected to a metal frame 12. And the same reference numerals are employed to designate parts or elements corresponding to those shown in FIG. 9.

In this case, a semiconductor chip 11a has bump electrodes 112 for external connection terminals, a bump electrode formation surface is face down connected to a bed section 121 of the metal frame 12, and pads on the semiconductor chip 11a are flip chip connected to corresponding bed section 121 of the metal frame 12 by a bump formed of, for example, gold, gold/tin alloy or solder.

In such a face-down connection structure, a package 10d can be made thinner than the semiconductor package 10 of FIG. 9 by an extent corresponding to the loop height level of a metal fine wire 14.

An explanation will be given below about the method for manufacturing a card type memory device shown in FIG. 14.

First prepared is a metal frame 12 having, as an integral unit, a bed section 121 and external terminal electrode section 122 with a step section formed therebetween as well as a semiconductor chip 11a having a nonvolatile semiconductor memory and bumps 112 for external connection terminals.

Then the bump formation surface of the semiconductor chip 11a is face down connected to the bed section 121 of the metal frame.

At least the bump formation surface and external peripheral surface of the semiconductor chip 11a and portion of the metal frame 12 are resin-sealed such that the electrode surface of an external terminal electrode section 122 of the metal frame is exposed substantially flush with a resin sealed body surface. By doing so, a semiconductor package 10d is formed.

Prepared is a card type base board 20 having a recess 201 in one surface side as shown in FIG. 10 and capable of holding the semiconductor package 10d therein. The semiconductor package 10d is buried in the recess 201 such that the electrode surface of the semiconductor package 10d is exposed substantially flush with the outer surface of the base board 20.

FIG. 15 shows an IC memory card type external memory device for allowing a card type memory device of the present invention to be fitted, as a practical application form, into an IC memory card slot of a personal computer, etc.

A card type adaptor 90 (adaptor card) has a 68-pins two-piece connection type having a configuration dimension substantially based on, for example, a JEIDA or PCMCIA standard and corresponding to a so-called type II of 85.6 mm in one dimension×54.0 mm in another dimension×5.0 mm in thickness. The adaptor has a structure adapted to be directly fitted, as a standard form, into an IC memory card slot, for instance, of the personal computer.

The adaptor card 90 has a card holding section for allowing the SSFDC 1 (trade name) as shown in FIG. 6 to be freely inserted into, and withdrawn out of, the adaptor card. As shown in FIG. 16, the card holding section has a connector 92, which, with the SSFDC 1 set in the card holding section, is electrically connectable with the electrode surface 122a of the external terminal electrode section of the SSFDC 1, an interface section 93 having an interface function to an adaptor card-utilizable apparatus (personal computer, etc.), and a push button 94, provided near the card access opening of the card holding section, for driving an ejecting mechanism (not shown) for ejecting the SSFDC 1 out of the card holding section when the push button 94 is externally operated by a single touch operation.

"or example, the connector 92 consists of a resilient contact which is a spring mechanism."

Further, the adaptor card, not shown together with a body of, for example, a personal computer or digital camera, may be molded as an integral unit. In this case, a connector, interface section and push button are mounted on the body itself. A push button for withdrawing an IC memory card from the card storage section is not necessarily required. In this case, an IC memory card is taken out manually for example.

Since the SSFDC 1 is fitted into the adaptor 90 based on the above-mentioned JEIDA or PCMCIA, an IC memory card type external memory device can be readily realized which ensures high reliability, fast access time, simple structure and ready detachment.

In comparison with the conventional IC memory card being used in a nearly fixed state, the card type external memory device of the present invention, being completely detachable in its structure, can be quantity-produced at low costs with the use of the originary semiconductor package technique.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A card type memory unit comprising:
    a semiconductor package including a semiconductor chip having a nonvolatile memory with external connection terminals formed there; a metal frame comprising bed sections with the semiconductor chip mounted thereon and external terminal electrode sections with a step section defined between the bed section and the external terminal electrode section, the external connection terminal of the semiconductor chip being electrically connected to the corresponding bed section, and a resin section with which at least one surface of the semiconductor chip and outer peripheral surface and at least electrode surfaces of the external terminal electrode section of the metal frame are sealed such that at least the electrode surfaces of the external terminal electrode sections of the metal frame are exposed substantially flush with an outer surface of the resin section; and a card-type base board having a recess in which the semiconductor package is buried such that the exposed electrode surfaces of the metal frame and resin-sealed surface of the semiconductor package are exposed substantially flush with an outer surface of the base board.

2. The card type memory unit according to claim 1, wherein the semiconductor chip has pads for external connection terminals and has one portion of a pad formation surface side which is bonded to the metal frame, electrical connection being made, as bonding connection, by metal fine wires between the pads and the metal frame.

3. The card type memory unit according to claim 1, wherein the semiconductor chip has pads for external connection terminals and has one surface side bonded to the bed sections of the metal frame, the one surface side of the chip being situated opposite a pad formation surface side, electrical connection being made, as bonding connection, by metal fine wires between the pads and the metal frame.

4. The card type memory unit according to claim 1, wherein the semiconductor chip has bump electrodes for external connection terminals and has a bump electrode formation surface which is face down connected to the bed sections of the metal frame.

5. The card type memory unit according to claim 1, wherein the metal frame has bed sections and separate external terminal electrode sections and electrical connection between the external terminal electrode sections of the metal plate and the external connection terminals of the semiconductor chip is made, as bonding connection, by metal fine wires.

6. The card type memory unit according to claim 1, wherein the semiconductor chip is resin sealed around its whole outer surface.

7. A card type memory device comprising:

(a) a card type memory unit comprising
a semiconductor package including a semiconductor chip having a nonvolatile memory with external connection terminals formed there; a metal frame comprising bed sections with the semiconductor chip mounted thereon and external terminal electrode sections with a step section defined between the bed section and the external terminal electrode section, the external connection terminals of the semiconductor chip being electrically connected to the corresponding bed sections, and a resin section with which at least one surface of the semiconductor chip and outer peripheral surface and at least electrode surfaces of the external terminal electrode section of the metal frame are sealed such that at least the electrode surfaces of the external terminal electrode sections of the metal frame are exposed substantially flush with an outer surface of the resin section; and a card-type base board having a recess in which the semiconductor package is buried such that the exposed electrode surfaces of the metal frame and resin-sealed surface of the semiconductor package are exposed substantially flush with an outer surface of the base board; and (b) a card type adaptor comprising
a card holding section for allowing the card type memory unit to be inserted therein or withdrawn therefrom;

a connector which, with the card type memory unit set in the card holding section, is set in contact with, and electrically connected to, the electrode surfaces of the external terminal electrode sections of the card type memory unit; and an interface section having an interface function to an associated apparatus.

8. The card type memory unit according to claim 7, further comprising: a push button provided near a card excess opening of the card holding section and adapted to drive an ejecting mechanism ejecting the card type memory unit out of the card holding section by a single external touch operation.

* * * * *